(12) United States Patent
Irino et al.

(10) Patent No.: US 6,894,369 B2
(45) Date of Patent: May 17, 2005

(54) SEMICONDUCTOR DEVICE HAVING A HIGH-DIELECTRIC GATE INSULATION FILM AND FABRICATION PROCESS THEREOF

(75) Inventors: Kiyoshi Irino, Kawasaki (JP); Yusuke Morisaki, Kawasaki (JP); Yoshihiro Sugita, Kawasaki (JP); Yoshiaki Tanida, Kawasaki (JP); Yoshihisa Iba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 103 days.

(21) Appl. No.: 10/109,001

(22) Filed: Mar. 29, 2002

(65) Prior Publication Data

US 2002/0146916 A1 Oct. 10, 2002

(30) Foreign Application Priority Data

Mar. 29, 2001 (JP) ........................................ 2001-097128
Mar. 19, 2002 (JP) ........................................ 2002-077055

(51) Int. Cl.[7] ............................................. H01L 23/58
(52) U.S. Cl. ........................ 257/637; 257/640; 257/649; 438/785; 438/786
(58) Field of Search ................................ 257/637, 640, 257/649; 438/785, 786

(56) References Cited

U.S. PATENT DOCUMENTS

| | | | | | |
|---|---|---|---|---|---|
| 6,482,694 | B2 | * | 11/2002 | Chittipeddi et al. | 438/240 |
| 6,602,753 | B2 | * | 8/2003 | Koyama et al. | 438/287 |
| 6,770,974 | B2 | * | 8/2004 | Ejiri | 257/758 |
| 2001/0029068 | A1 | * | 10/2001 | Chittipeddi et al. | 438/142 |
| 2002/0137339 | A1 | * | 9/2002 | Takeuchi | 438/688 |
| 2004/0072383 | A1 | * | 4/2004 | Nagahama et al. | 438/47 |
| 2004/0152340 | A1 | * | 8/2004 | Yamamoto et al | 438/778 |

FOREIGN PATENT DOCUMENTS

| | | |
|---|---|---|
| EP | 1 124 262 A2 | 8/2001 |
| JP | 2001-267566 | 9/2001 |

* cited by examiner

*Primary Examiner*—Alexander Ghyka
(74) *Attorney, Agent, or Firm*—Westerman, Hattori, Daniels & Adrian, LLP

(57) ABSTRACT

An ultra high-speed semiconductor device has a high-K dielectric gate insulator layer, wherein spread of impurities to a Si substrate from a gate electrode through the high-K dielectric gate insulator layer, and spread of oxygen and metallic elements from the high-K dielectric gate insulator layer to the Si substrate or the gate electrode are suppressed by arranging the high-K dielectric film sandwiched by nitrogen atomic layers on the Si substrate that is covered by an oxygen atomic layer.

17 Claims, 16 Drawing Sheets

SEMICONDUCTOR DEVICE HAVING A HIGH-DIELECTRIC GATE INSULATION FILM AND FABRICATION PROCESS THEREOF

CROSS REFERENCE TO RELATED APPLCIATION

The present application is based on Japanese priority applications No. 2001-097128 filed on Mar. 29, 2001 and No. 2002-77055 filed on Mar. 19, 2002, with the Japanese Patent Office, the entire contents of which are hereby incorporated by reference.

BACKGROUND OF THE INVENTION

1. Field of the Invention

The present invention generally relates to semiconductor devices, and particularly relates to semiconductor devices having a high-K dielectric film of metal oxide or metal silicate, and a fabrication process thereof.

2. Description of the Related Art

Since semiconductor integrated circuit devices, such as CMOS LSI, are required to operate at an ultra high-speed, the devices are structured by electric field effect type transistors (MOSFET) that have a very short gate length. To attain the ultra high-speed operations, intensive efforts have been made on miniaturization of MOSFET.

In miniaturization of MOSFET, thinning of a gate insulation film is also required. For example, decreasing film thickness of the gate insulation film to about 2.5 nm or less in terms of oxide equivalent thickness is called for.

Conventionally, silicon oxides having excellent leakage characteristics and small interface level density have been used for the gate insulation film of MOSFETs. However, the conventional gate insulation film of silicon oxide suffers from the problem of increased direct tunnel current, as the physical thickness of the gate insulation film gets thinner. Any film thickness less than the value described above will cause a paramount problem of the gate leakage current due to the direct tunnel current. If the gate leakage current is increased, a substantial leakage current keeps flowing during a gate-off period, causing problems, such as abnormal operations and higher power consumption.

In order to solve the problems, the use of high-K dielectric films, such as metal oxide metals and metal silicates, has been studied. In the present invention, a high-K dielectric film is used in the sense to indicate a dielectric film having a specific dielectric constant of 10 or more.

However, in the high-K dielectric gate insulation film that employs metal oxide or metal silicate, there arises a problem of unstable operations of MOSFET, due to a phenomenon that boron doped to the gate electrode penetrates to the high-K dielectric gate insulation film, and hydrogen in gas used in manufacturing processes attacks the high-K dielectric gate insulation film. Further, there is a possibility that reactions, such as silicide formation, may arise at an interface between a silicon substrate and the high-K dielectric gate insulation film or at an interface between the high-K dielectric gate insulation film and a poly silicon gate electrode, when forming a gate structure containing the high-K dielectric gate insulation film on the silicon substrate surface.

Conventionally, studies on the high-K dielectric gate insulation film have primarily been conducted in relation to suppressing the direct tunnel current, and studies about stability of the device characteristics have not been extensively conducted.

For example, JP, 2001-267566 discloses a gate insulation layer that consists of a first SiN molecular layer formed by a so-called single atomic layer depositing (atomic layer CVD) method on a Si substrate surface, a high-K dielectric layer such as a $ZrO_2$ layer formed on the SiN molecular layer by repeatedly forming an oxygen atomic layer and a Zr atomic layer, each formed by the atomic layer CVD method, and a second SiN molecular layer formed on the high-K dielectric layer by the atomic layer CVD method. Further, the related technology also discloses a gate insulation layer that consists of a first $SiO_2$ molecular layer formed by a so-called single atomic layer depositing (atomic layer CVD) method on a Si substrate surface, a high-K dielectric layer such as a $ZrO_2$ layer formed on the SiN molecular layer by repeatedly forming an oxygen atomic layer and a Zr atomic layer, each formed by the atomic layer CVD method, and a second $SiO_2$ molecular layer formed on the high-K dielectric layer by the atomic layer CVD method.

The dielectric gate insulation film such as above has small oxide equivalent thickness, and can effectively suppress the gate leakage current caused by the direct tunneling effect when applied to an ultra high-speed semiconductor device having gate length of 0.1 micrometers or less.

However, with the structure in which the first and the second SiN molecular layers vertically sandwich the high-K dielectric film, the Si substrate surface cannot be uniformly and completely covered by nitrogen atoms due to a difference between the valence of Si and nitrogen, but a dangling bond will inevitably arise. If a dangling bond arises in the gate insulation film, especially in the interface with the Si substrate surface, which serves a channel region, threshold characteristics of the semiconductor devices are changed by a carrier trap and the like.

In the case of the foregoing prior art in which the high-K dielectric film is vertically sandwiched by a pair of $SiO_2$ molecular layers, on the other hand, there are no dangling bond formed at the interface between the Si substrate and the gate insulation film. However, because of absence of the nitrogen atomic layer in the gate insulation film, there arises a problem that the B dopant in the polysilicon gate electrode spreads into the Si substrate through the gate insulation film, and threshold characteristics of the semiconductor device are changed. Further, in such a high-K dielectric gate insulation film that lacks the nitrogen atomic layer therein, there arises a problem that oxygen in the high-K dielectric film easily reaches the Si substrate by diffusion and causes degradation of carrier mobility in the channel region. Further, there may be caused a problem of diffusion of metal element such as Zr to the Si substrate from the gate insulation film. The metal element thus reached the Si substrate may cause a reaction such as silicide formation.

Thus, the conventional high-K dielectric gate insulation film has suffered from the problem of dangling bond formation at the interface between the Si substrate and the high-K dielectric gate insulation film, and the problem of penetration of impurity element through the high-K dielectric gate insulation film. Further, the problems of diffusion of oxygen and metal elements are also unresolved. Thus, the expected advantageous effect of the high-K dielectric insulation film has not been achieved even when the semiconductor device is produced by using a high-K dielectric gate insulation film.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a high-K dielectric gate insulation film and manufacturing process thereof, wherein the problem of boron penetration, and the problem of device characteristic change, caused by a reducing atmosphere such as hydrogen contained in a gas used in device manufacturing, are solved successfully, and wherein the reaction between the high-K dielectric gate insulation film and the Si substrate, and reaction between the high-K dielectric gate insulation film and the gate electrode are suppressed successfully.

Another object of the present invention is to provide a A semiconductor device comprising:

a channel area formed in a Si crystal layer, a gate insulation film formed on the channel area, containing a SiO layer that is formed on the Si crystal layer, a first SiN layer formed on the SiO layer, a dielectric metal oxide layer formed on the first SiN layer, and a second SiN layer formed on the dielectric metal oxide layer, and a gate electrode formed on the gate insulation film.

Another object of the present invention is to provide a semiconductor device, comprising:

a Si substrate, a gate insulation film formed on the Si substrate, and a gate electrode formed on the gate insulation film; wherein the gate insulation film, comprising:

a first insulation film that comprises an oxygen atomic layer consisting of oxygen atoms, each of which is bonded with a Si atom of surface of the Si substrate, a first Si atomic layer consisting of Si atoms, each of which is bonded with an oxygen atom in the oxygen atomic layer, a nitrogen atomic layer consisting of nitrogen atoms, each of which is bonded with a Si atom in the Si atomic layer, and a second Si atomic layer, consisting of Si atoms, each of which is bonded with a nitrogen atom in the nitrogen atomic layer, a second insulation film that comprises an oxygen atomic layer consisting of oxygen atoms, each of which is bonded with a Si atom in the second Si atomic layer, a metal atomic layer consisting of metal atoms, each of which is bonded with an oxygen atom in the oxygen atomic layer, an oxygen atomic layer consisting of oxygen atoms, each of which is bonded with a metal atom in the metal atomic layer, and, at the topmost part, a topmost oxygen atomic layer consisting of oxygen atoms, each of which is bonded with a metal atom in the metal atomic layer, and a third insulation film that comprises a Si atomic layer that covers the topmost oxygen atomic layer, consisting of Si atoms, each of which is bonded with an oxygen atom in the topmost oxygen atomic layer, and a nitrogen atomic layer, consisting of nitrogen atoms, each of which is bonded with a Si atom in the Si atomic layer that covers the topmost oxygen atomic layer.

Another object of the present invention is to provide fabrication process of a semiconductor device, comprising:

(A) a process wherein gas-phase Si is supplied to Si substrate surface, such that the Si substrate surface adsorbs Si molecules in single molecule thickness, (B) a process wherein a gas containing oxygen is supplied to the Si substrate surface that adsorbed the Si molecules after the process (A), such that the adsorbed Si molecules are oxidized, producing a SiO molecule layer on the Si substrate surface, (C) a process wherein gas-phase Si is supplied to the Si substrate surface which is covered by the SiO molecule layer after the process (B), such that Si molecules are adsorbed in single molecule thickness, (D) a process wherein a gas containing nitrogen is supplied to the Si substrate surface that adsorbs the Si molecules after the process (C), such that the adsorbed Si molecules form a SiN molecule layer on the Si substrate surface, (E) a process wherein a gas containing oxygen, and a gas containing metallic elements are alternately supplied to the Si substrate surface that is covered by the SiN molecule layer after the process (D), such that a dielectrics metal oxide film is formed, (F) a process wherein gas-phase Si is supplied to the substrate surface which is covered by the dielectric metal oxide film after the process (E), such that Si molecules are adsorbed in single molecule thickness, forming a Si molecule layer, and (G) a process wherein a gas containing nitrogen is supplied to the substrate surface, which is covered by the Si molecule layer after the process (F), such that the adsorbed Si molecules form a SiN molecule layer on the Si substrate surface.

Features and advantages of the present invention will be set forth in the description which follows, and in part will become apparent from the description and the accompanying drawings, or may be learned by practice of the invention according to the teachings provided in the description.

Objects as well as other features and advantages of the present invention will be realized and attained by a semiconductor device and a manufacturing method thereof particularly pointed out in the specification in such full, clear, concise, and exact terms as to enable a person having ordinary skill in the art to practice the invention.

DESCRIPTION OF THE PREFERRED EMBODIMENTS

In the following, embodiments of the present invention will be described with reference to the accompanying drawings.

FIGS. 1A through 1J show the fabricating process of a high-K dielectric gate insulation film on a Si substrate 1 of the first embodiment of the present invention.

Although the high-K dielectric gate insulation film is formed by an atomic layer depositing method in the following explanation, the high-K dielectric gate insulation film can also be formed, for example, by an MBE method and the like.

Figure 1A:
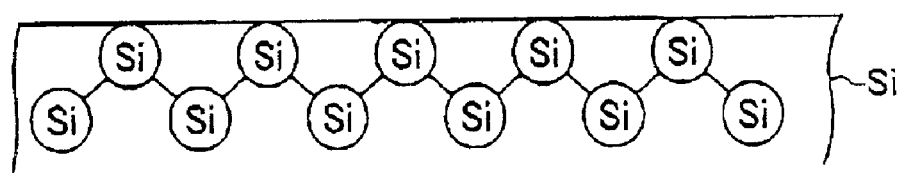
FIGS. 1A–FIG. 1J are diagrams showing the fabrication processes of a semiconductor device according to a first embodiment of the present invention.
Figure 1B:
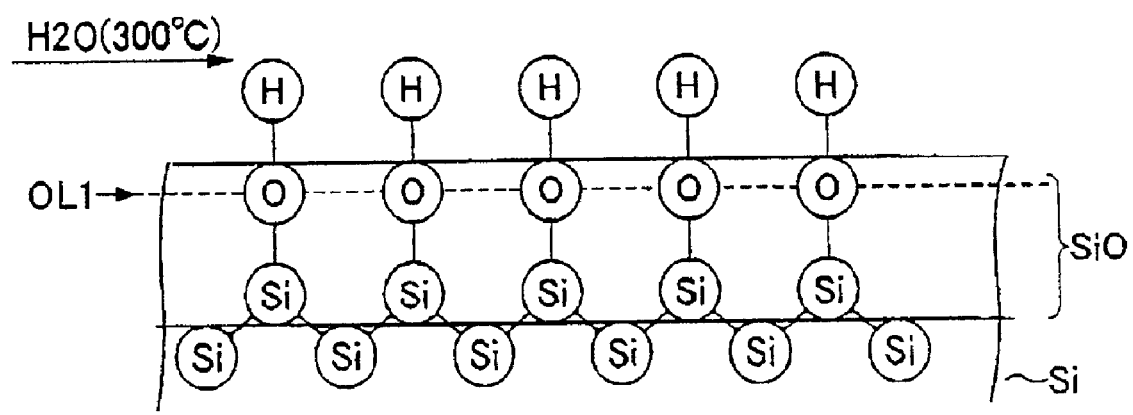

After removing a natural oxide film on the surface of the Si substrate 1 and exposing Si atoms of the surface of the substrate with reference to FIG. 1A, $H_2O$ (steam) is supplied typically at a substrate temperature of 300 degrees C., and $H_2O$ molecules are adsorbed to the surface of the Si substrate 1 in the process of FIG. 1B. As a result, the surface of the Si substrate 1 is uniformly covered by a single atom thick oxygen atomic layer $OL_1$. In that case, a bond of each oxygen atom in the oxygen atomic layer $OL_1$ is bonded with a Si atom of the Si substrate, and the other bond of the oxygen atom is bonded with a hydrogen atom. Consequently, a $SiO_2$ layer 2 is formed on the surface of the Si substrate 1 in thickness of one molecule, and the surface of the $SiO_2$ molecule layer 2 is covered by OH basis. Although the oxygen atomic layer $OL_1$ may not be one atom thick strictly, 90% or more of oxygen atoms are bonded with corresponding Si atoms on the Si substrate surface, which can be substantially considered that it is a single atom thick layer.

Figure 1C:
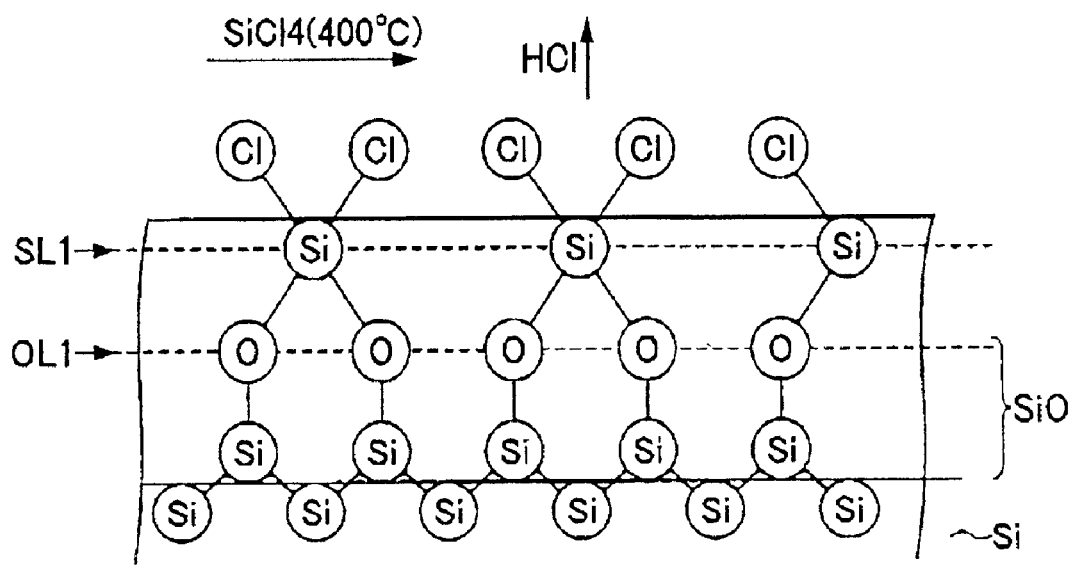

Next, in the process of FIG. 1C, $SiCl_4$ gas is supplied to the surface of the structure of FIG. 1B at the substrate temperature of 400 degrees C., and $SiCl_4$ molecules are adsorbed. In that case, hydrogen atoms in the OH basis on the surface of the oxygen atomic layer OL1 react with the $SiCl_4$ molecules, and are removed in the form of HCl, consequently the surface of the Si substrate is uniformly covered by the Si atomic layer SL 1 in single atom thickness. Two bonds of a Si atom in the Si atomic layer SL 1 produced in this manner are bonded with two oxygen atoms in the oxygen atomic layer O1, and other two bonds of the Si atom are bonded with two Cl atoms. Although the Si atomic layer SL 1 may not be in single atom thickness strictly, 90% or more of Si atoms are bonded with corresponding oxygen atoms of the oxygen atomic layer $OL_1$, which can be substantially regarded as a single atom thick layer.

Figure 1D:
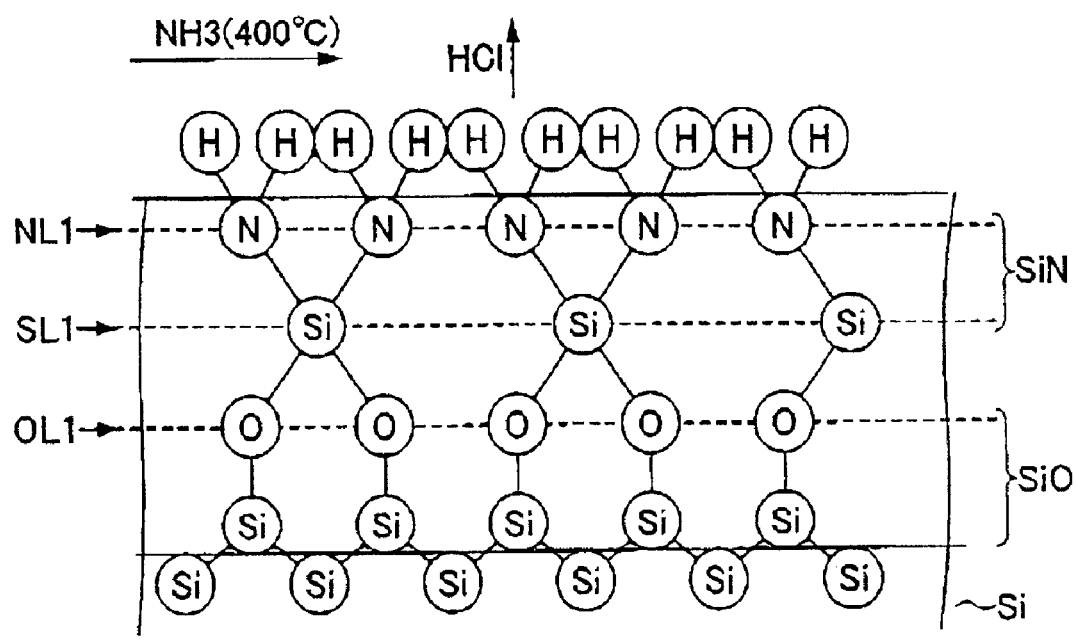

Next, in the process of FIG. 1D, $NH_3$ gas is supplied to the surface of the structure of FIG. 1C at the substrate temperature of 400 degrees C., then, a nitrogen atomic layer $NL_1$ in single atom thickness is formed by replacing the Cl atoms of each Si atom in the Si atomic layer with nitrogen atoms. In that case, the Cl atoms previously bonded with the Si atoms in the Si atomic layer $SL_1$ are removed in the form of HCl. Each of the nitrogen atoms formed in this manner is bonded with hydrogen atoms with two bonds that are not bonded with Si atoms. Through the process of FIG. 1D, a one molecule thick SiN layer 3 is formed on the one molecule thick $SiO_2$ molecule layer 2. Although the nitrogen atomic layer $NL_1$ may not be in the thickness of one atom strictly, 90% or more of the nitrogen atoms are bonded with corresponding Si atoms in the Si atomic layer $SL_1$, which can be regarded substantially a single atom thick layer.

Figure 1E:
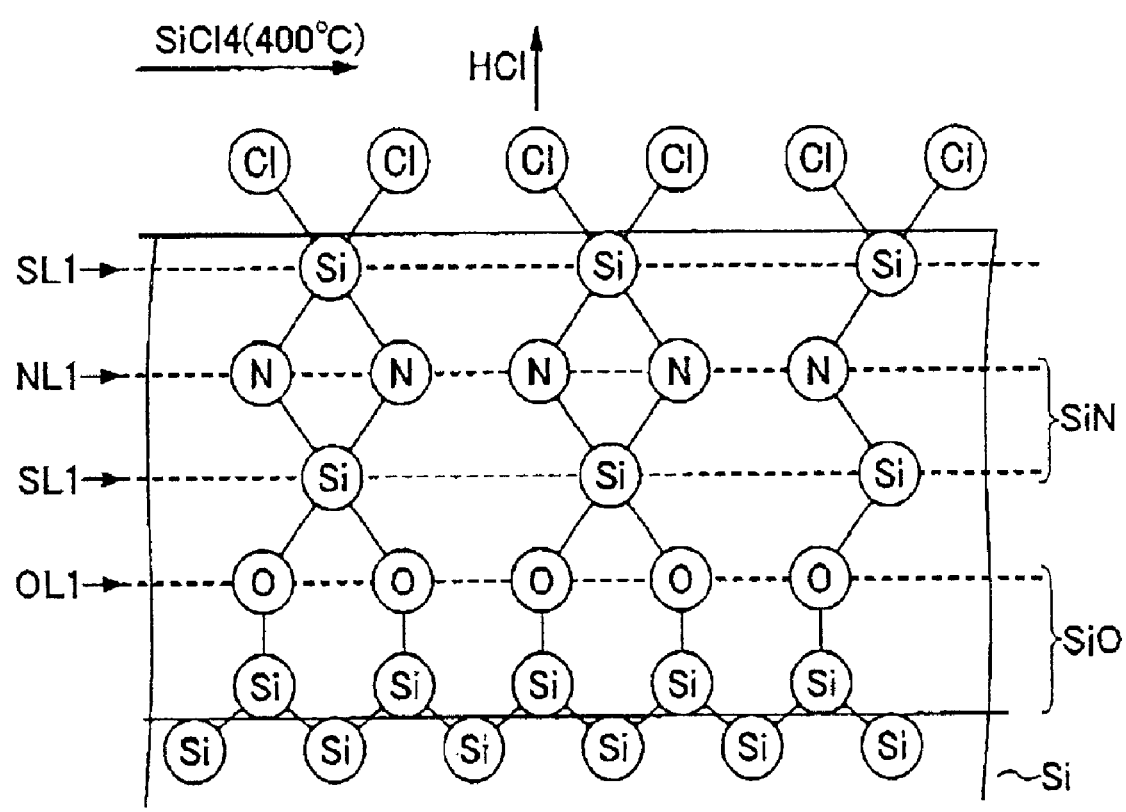

Next, in the process of FIG. 1E, $SiCl_4$ gas is supplied to the surface of the structure of FIG. 1D at the substrate temperature of 400 degrees C., and $SiCl_4$ molecules are adsorbed uniformly. In that case, the hydrogen atoms bonded with the nitrogen atoms in the nitrogen atomic layer $NL_1$ are removed in the form of HCl. Consequently, the surface of the nitrogen atomic layer $NL_1$ is uniformly covered by a Si atomic layer $SL_2$ in single atom thickness. Thus, each of two bonds of a Si atom in the formed Si atomic layer $SL_2$ is bonded with a nitrogen atom in the nitrogen atomic layer. Each of the remaining two bonds of the Si atom in the SiN molecule layer are bonded with a Cl atom. Although the Si atomic layer $SL_2$ may not be in single atom thickness strictly, 90% or more of Si atoms are bonded with corresponding nitrogen atoms in the nitrogen atomic layer $NL_1$, which can be substantially regarded as a single atom thick layer.

Figure 1F:
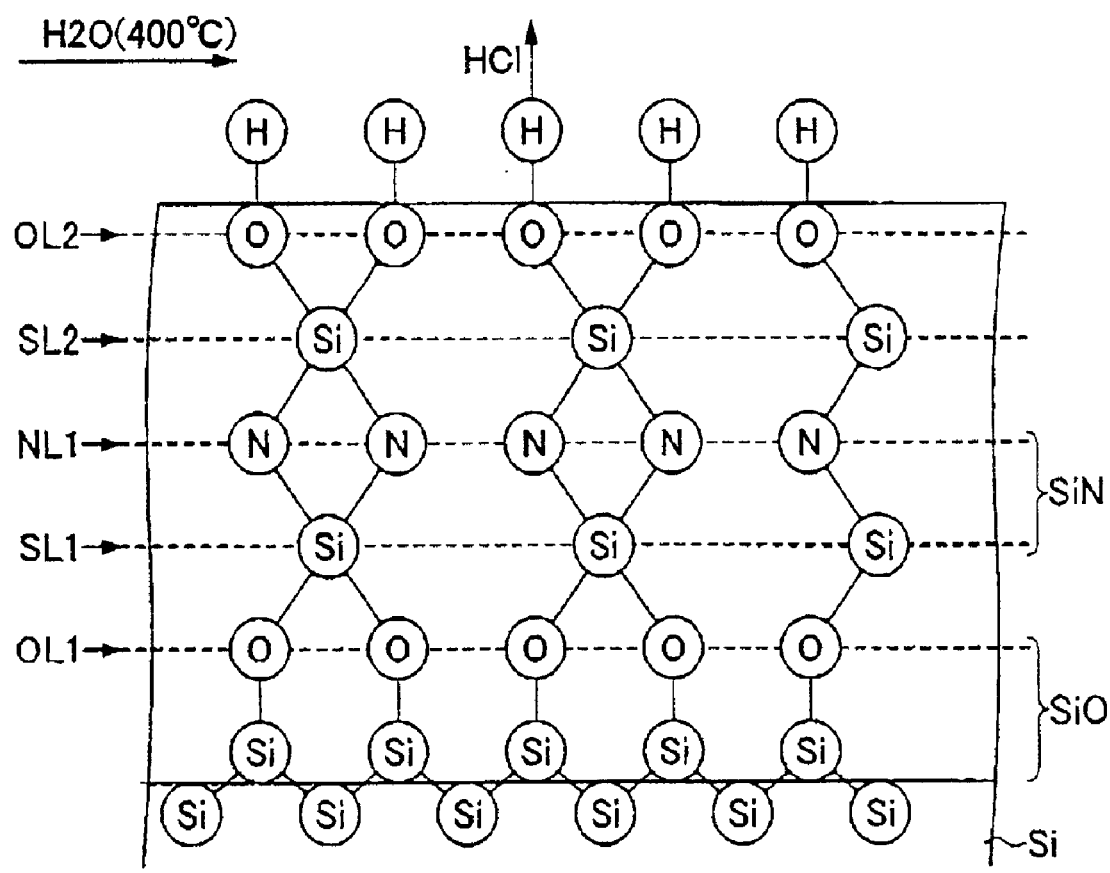

Next, in the process of FIG. 1F, steam ($H_2O$) is supplied to the surface of the structure of FIG. 1E at the substrate temperature of 400 degrees C. Then, Cl atoms that were bonded with Si atoms in the Si atomic layer $SL_2$ are removed in the form of HCl, and an oxygen atomic layer $OL_2$ is formed, wherein oxygen atoms are bonded with Si atoms in the Si atomic layer $SL_2$. The oxygen atoms in the oxygen atomic layer $OL_2$ and the Si atoms in the Si atomic layer $SL_2$ may be considered as constituting a $SiO_2$ monomolecular layer, also they can be regarded as constituting a part of a high-K dielectric film as explained below. Each hydrogen atom is bonded with an oxygen atom in the oxygen atomic layer $OL_2$, forming an OH base. Although the oxygen atomic layer $OL_2$ may not be in single atom thickness strictly, 90% or more of oxygen atoms are bonded with Si atoms in the Si atomic layer $SL_2$, which can be substantially regarded as a single atom thick layer.

Figure 1G:
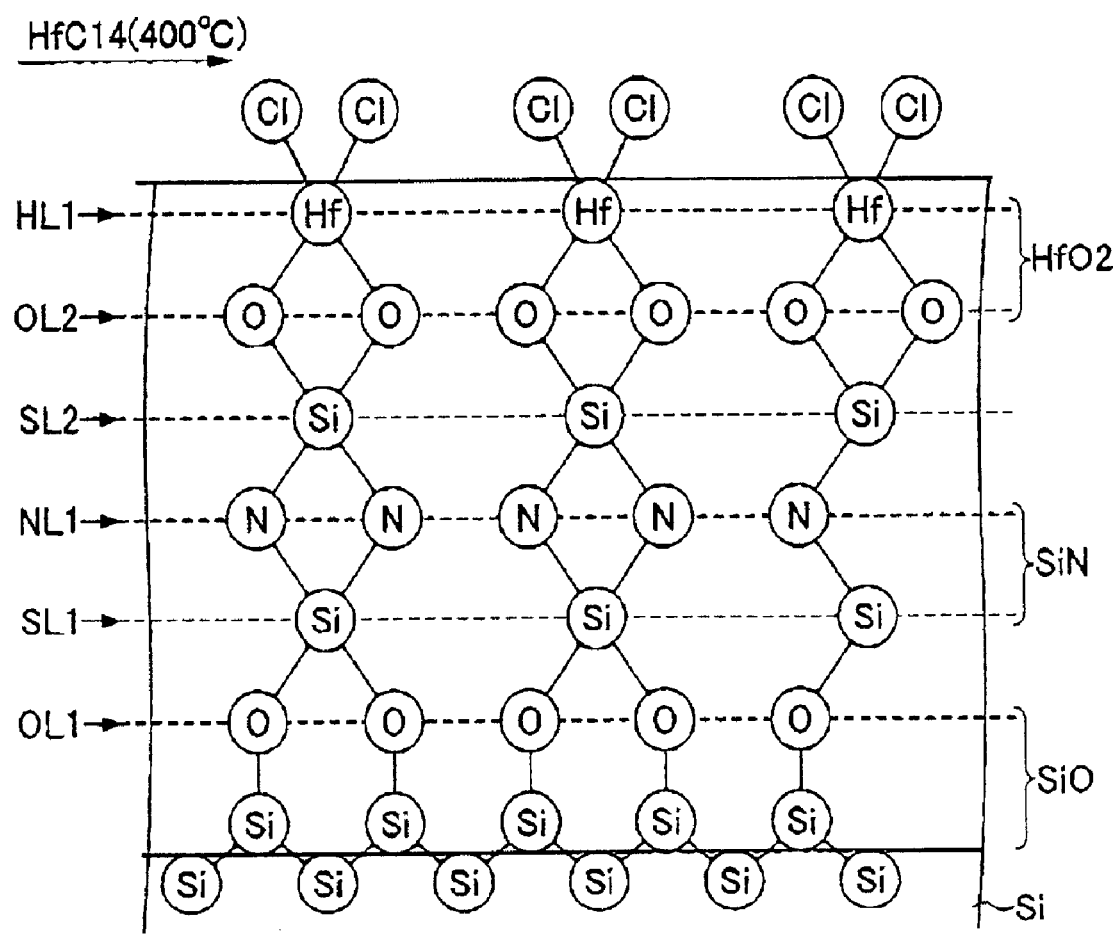

In the process of FIG. 1G, $HfCl_4$ gas is supplied to the surface of the structure of FIG. 1F, and $HfCl_4$ molecules are uniformly adsorbed on the oxygen atomic layer $OL_2$. In that case, the hydrogen atom that forms the OH base on the surface of the oxygen mono-atomic layer $OL_2$ reacts with an $HfCl_4$ molecule, and is removed in the form of HCl. Consequently, the oxygen atomic layer $OL_2$ is uniformly covered by a Hf atomic layer $HL_1$ in single atom thickness. Two bonds of a Hf atom of the formed Hf atomic layer $HL_1$ are bonded with two oxygen atoms in the oxygen atomic layer $OL_2$, and each of two other bonds is bonded with a Cl atom. Although the Hf atomic layer $HL_1$ may not be in single atom thickness strictly, either, 90% or more of the Hf atoms in the Hf atomic layer $HL_1$ are bonded with corresponding oxygen atoms of the oxygen atomic layer $OL_2$, which can be considered substantially that the Hf atomic layer $HL_1$ is in single atom thickness.

Figure 1H:
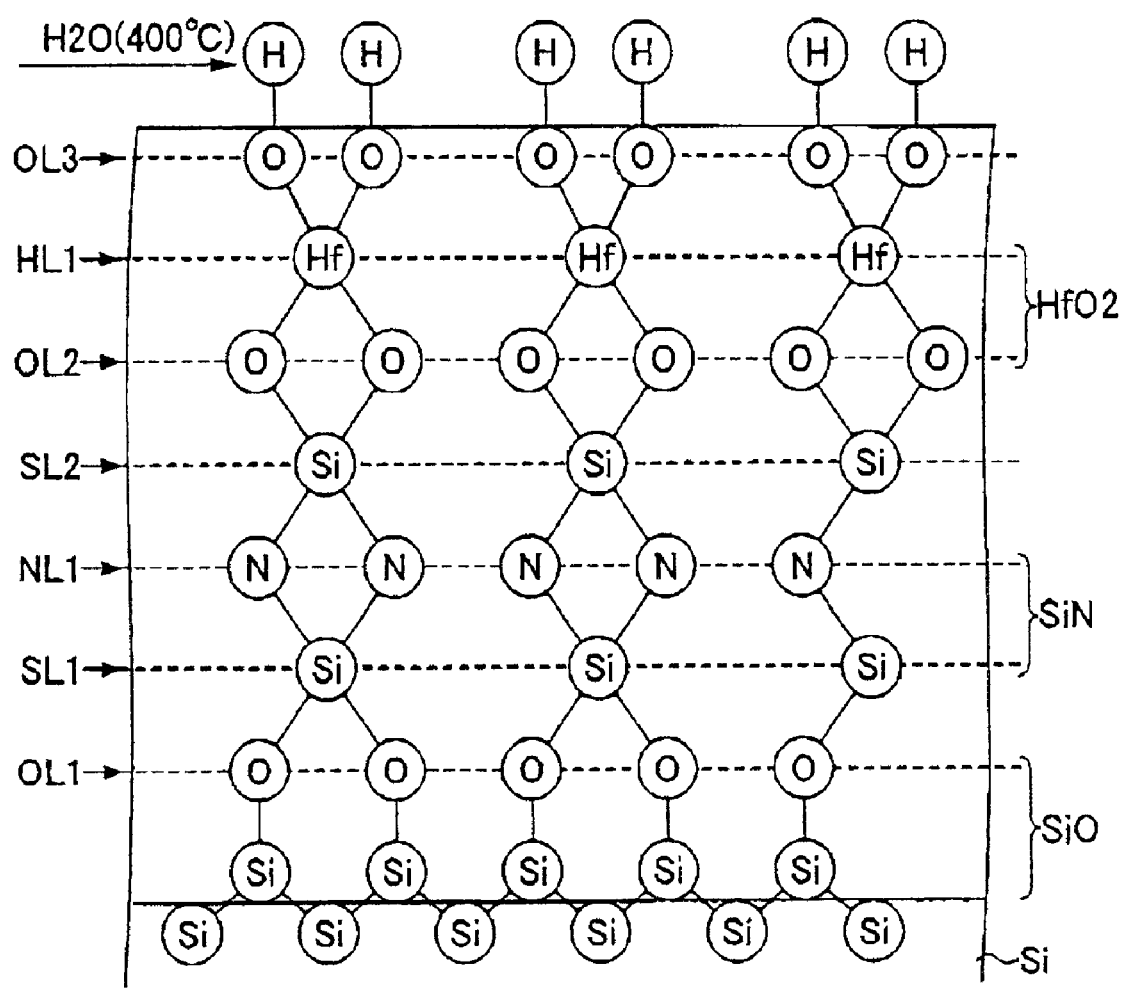

Next, in the process of FIG. 1H, steam ($H_2O$) is supplied to the surface of the structure of FIG. 1G at the substrate temperature of 400 degrees C. As a result, the Cl atoms bonded with the Hf atoms in the Hf atomic layer $HL_1$ are removed in the form of HCl, and an oxygen atomic layer $OL_3$ that consists of oxygen atoms that are bonded with the Hf atoms in the Hf atomic layer $SL_2$ is formed. The oxygen atoms in the oxygen atomic layer $OL_3$ form a $HfO_2$ monomolecular layer with the Hf atoms in the Hf atomic layer $HL_1$. Further, a hydrogen atom is bonded with each of the oxygen atoms in the oxygen atomic layer $OL_3$, and an OH base is formed. Also in the oxygen atomic layer $OL_3$, 90% or more of oxygen atoms are bonded with corresponding Hf atoms of the Hf atomic layer $HL_1$, which can be substantially regarded as constituting a single atom thick layer.

Figure 1I:
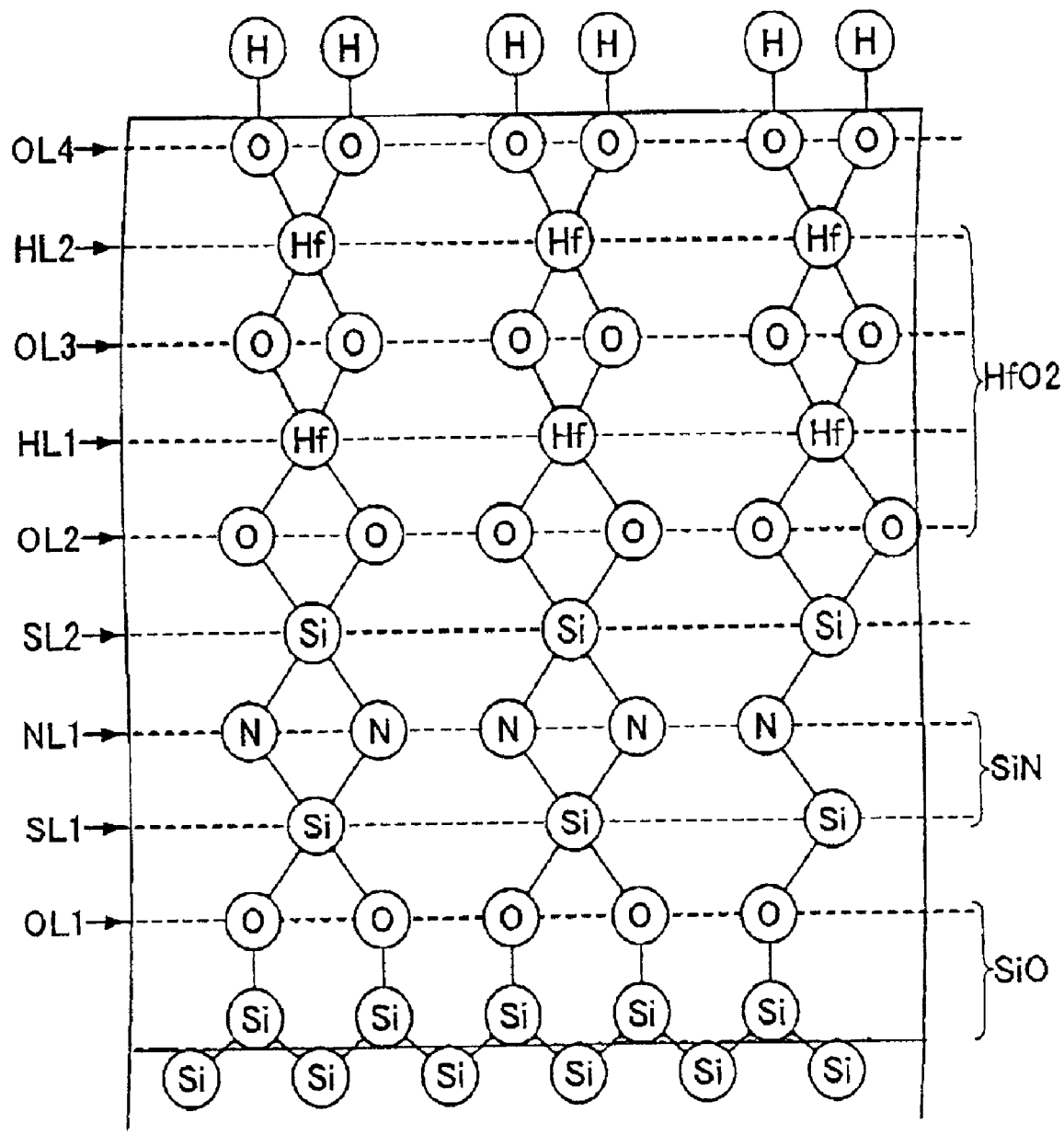

Further, the processes of FIG. 1G and FIG. 1H may be repeated an arbitrary number of times at the process of FIG. 1I, thereby a $HfO_2$ layer 4, consisting of an oxygen atomic layer $OL_3$ and a Hf atomic layer $HL_2$, is formed on the $HfO_2$ monomolecular layer, and an oxygen atomic layer $OL_4$ is further formed on the Hf atomic layer $HL_2$. Although the oxygen atomic layer $OL_3$ and the Hf atomic layer $HL_2$ may not be in single atom thickness strictly, either, they can be substantially regarded as single atom thick layers.

Figure 1J:
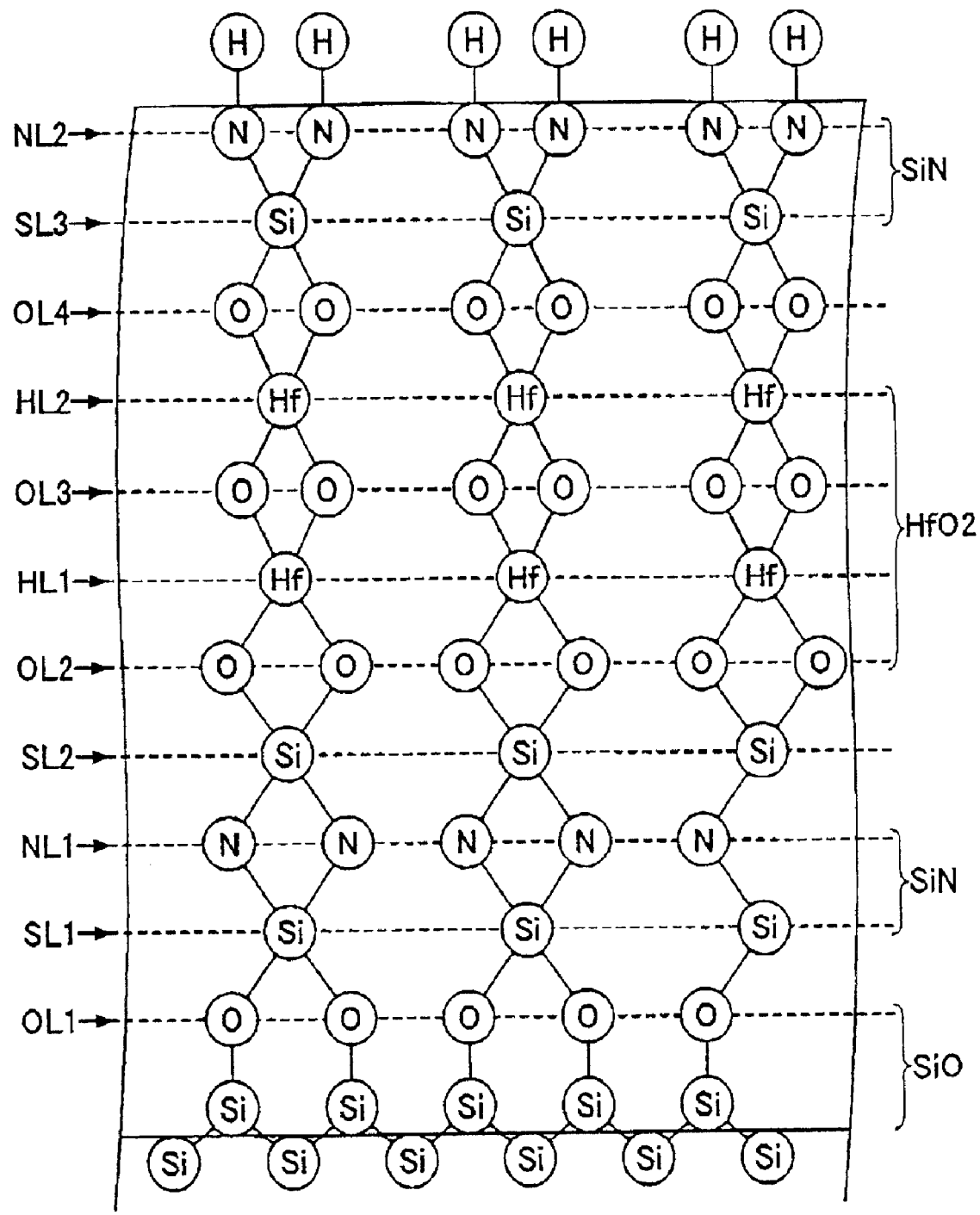

Further, in the process of FIG. 1J, $SiCl_4$ gas and $NH_3$ gas are supplied one by one to the structure of FIG. 1I, and a SiN monomolecular layer 5, consisting of a Si atomic layer $SL_3$ and a nitrogen atomic layer $NL_2$, is formed on the oxygen atomic layer $OL_4$. Although the Si atomic layer $SL_3$ and the nitrogen atomic layer $NL_2$ may not be strictly single atom thick layers, they can be substantially regarded as single atom thick layers like the previous atomic layers $OL_1$ through $OL_4$.

The processes of FIG. 1A through FIG. 1J are performed such that a thickness measured from the atomic layer $OL_1$ to the atomic layer $NL_2$ one to several nanometers, and a high-K dielectric gate insulation film is produced, on which gate electrodes, such as of poly silicon, are formed.

In the processes of FIG. 1A through FIG. 1J, especially in the process of FIG. 1A where the Si substrate surface is directly and uniformly covered by the oxygen atomic layer $OL_1$, neither a dangling bond nor an interface level is formed in an interface, and a high quality $SiO_2$ monomolecular layer 2 is formed. Accordingly, when the semiconductor device operates and the channel region transports a carrier at a high speed, the carrier is not captured by a dangling bond and an interface level, thereby threshold characteristics and leakage characteristics of the semiconductor device will not suffer from deterioration.

Further, since the SiN monomolecular layer 3 is formed on the $SiO_2$ monomolecular layer 2 in the process of FIG. 1D, when the $HfO_2$ layer is formed on this SiN layer 3 in the processes of FIG. 1G through FIG. 1I, spreading into the Si substrate of Hf and oxygen of the $HfO_2$ layer is effectively suppressed. Further, with this structure, since the N atomic layer of the SiN monomolecular layer is separated from the surface of the Si substrate by the oxygen atomic layer $OL_1$ and the Si atomic layer $SL_1$, a fluctuation of threshold characteristics of the semiconductor device due to a fixed charge of the N atom is avoided.

Similarly, in this embodiment, the SiN molecule layer containing the nitrogen atomic layer $NL_2$ is formed on the $HfO_2$ layer, thereby spread of Hf and oxygen from the $HfO_2$ layer to the poly silicon gate electrode is suppressed effectively. Further, dopant spread of B and the like from the poly silicon gate electrode to the Si substrate is also suppressed effectively.

In the high-K dielectric gate insulation film having the structure as shown in FIG. 1J, it is important that the high-K dielectric film consisting of a laminating of $HfO_2$ layers is sandwiched by the oxygen atomic layers $OL_2$ and $OL_4$. Thereby, each Hf atom is bonded with four oxygen atoms, steadily holding the Hf atom in a tetravalent state, and avoiding generation of an oxygen deficit by reduction and the like.

In this embodiment, one oxygen atomic layer $OL_1$ and one Si atomic layer $SL_1$ are provided. However, a plurality of oxygen atomic layers and a plurality of Si atomic layers may be provided. Similarly, a plurality of nitrogen atomic layers $NL_1$ and Si atomic layers $SL_2$ may be provided. However, if thickness of the $SiO_2$ layer, which is of a low dielectric constant, increases under the $HfO_2$, the effect of using $HfO_2$ that is of a high-K dielectric constant will decrease. Therefore, there is a limit in increasing film thickness of the $SiO_2$.

As an alternative material for the high-K dielectric film, $ZrO_2$ may be considered. However, $ZrO_2$ tends to produce martensite type phase transition in the temperature range used in the semiconductor process. For this reason, it is more desirable to use $HfO_2$ that generates a phase transition at a higher temperature.

Further, the alternative material for the high-K dielectric film includes oxide and silicate of Sr, Ba, Ta, Ti, Y, Lr, and metallic elements of lanthanoid.

Figure 2:
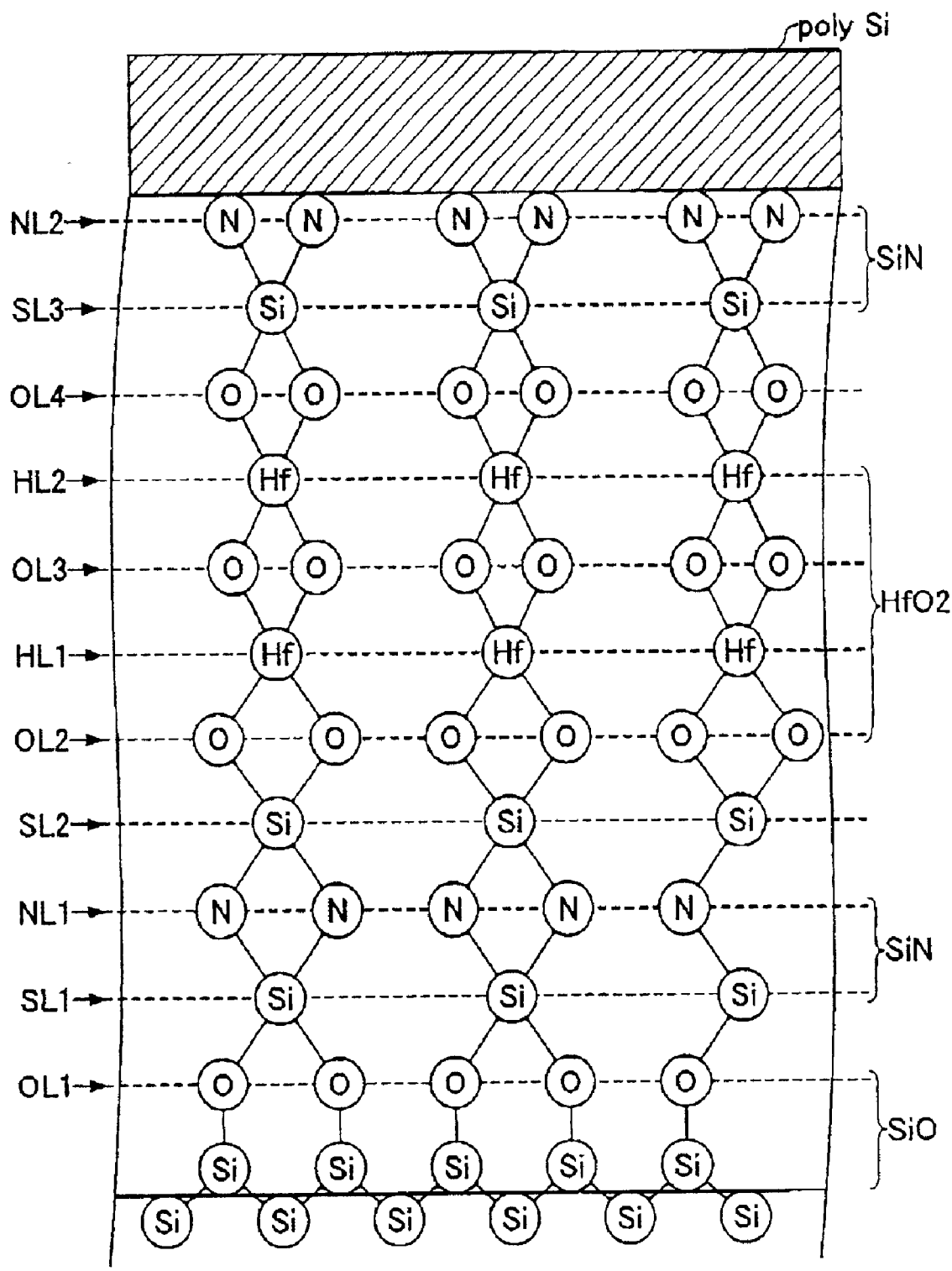
FIG. 2 is a diagram showing the structure of a sample produced from the structure of FIG. 1J for measurement of a gate leakage current.

FIG. 2 shows a structure of a sample, wherein a poly silicon layer 6 is arranged as an electrode on the high-K dielectric gate insulation film that is formed in the manner described above.

Figure 3:
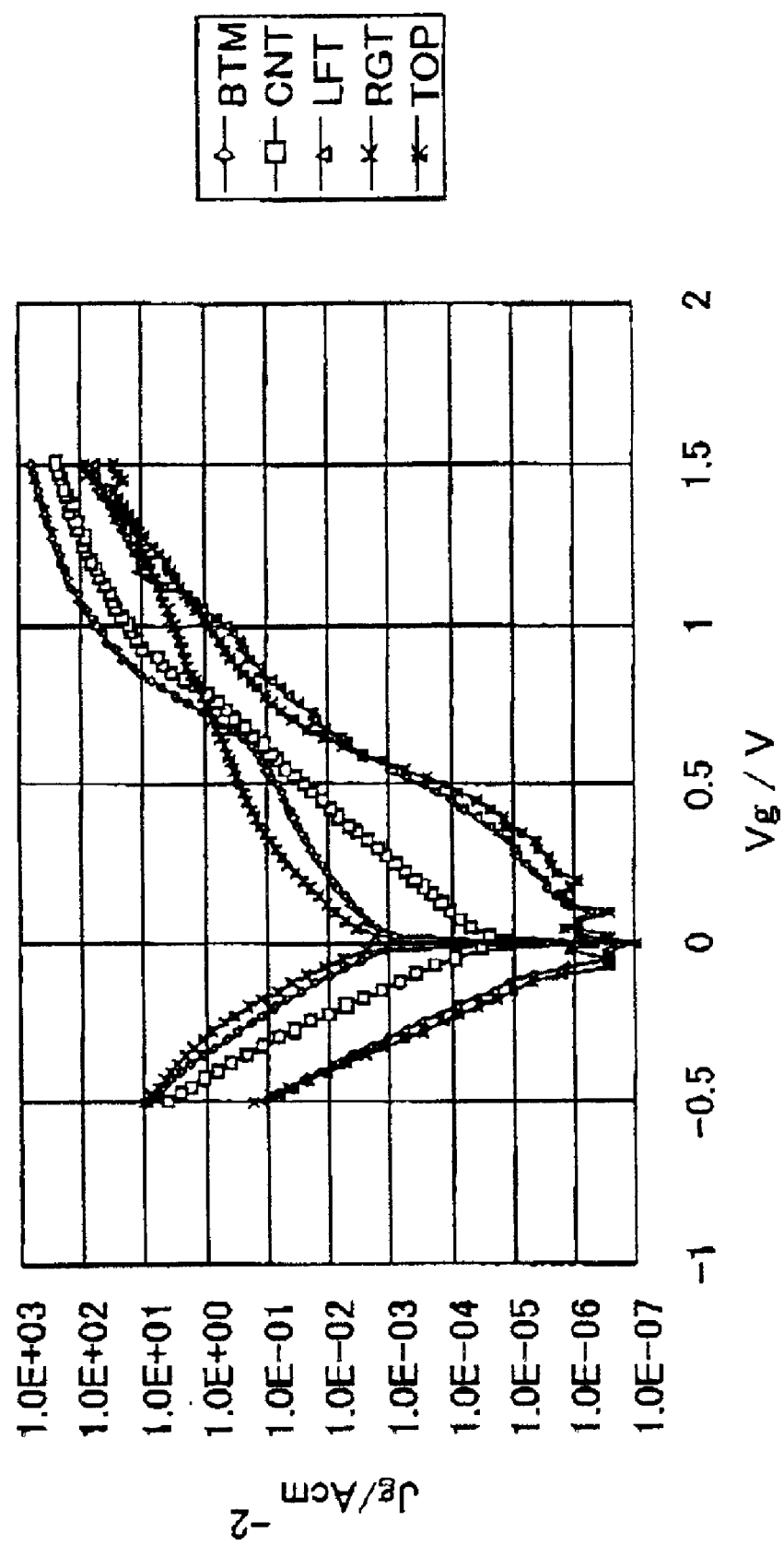
FIG. 3 is a diagram showing the characteristics of the gate leakage current where a nitrogen atomic layer of FIG. 1J is not formed in the sample of FIG. 2.
Figure 4:
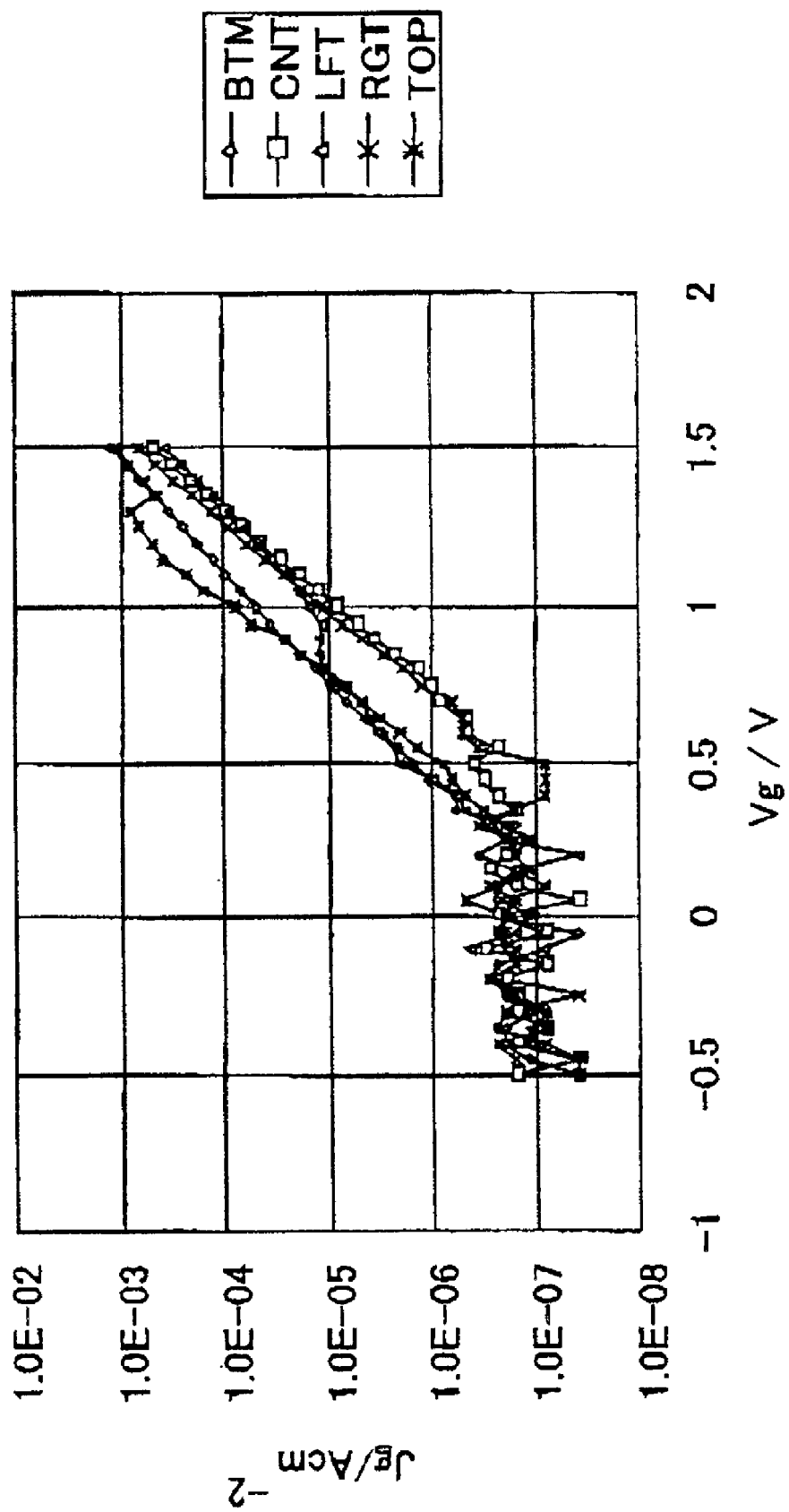
FIG. 4 is a diagram showing the gate leakage current characteristics where the nitrogen atomic layer of FIG. 1J is formed in the sample of FIG. 2.

FIG. 3 and FIG. 4 show measurement results of the leakage current characteristics of the sample shown in FIG. 2. However, the result shown in FIG. 3 represents the case where the nitrogen atomic layers NL1 and NL2 in FIG. 1J are omitted. In the case of FIG. 4, the nitrogen atomic layers $NL_1$ and $NL_2$ are formed by heat process of $NH_3$ gas at 650 degrees C. in the process of FIG. 1D and FIG. 1J, respectively, and the oxygen atomic layer and the nitrogen atomic layer are formed such that a total thickness becomes about 1 nm. In either case, the $HfO_2$ layer has a 3 nm film thickness on the whole. After the $HfO_2$ layer is formed, a rapid heat treating is performed for 30 seconds at 700 degrees C., then, a polysilicon electrode is formed at 590 degrees C., then, heat treating for 5 seconds at 1000 degrees C. is performed for activating heat processing of a dopant. In FIG. 3 and FIG. 4, different curves express results of different pieces of the sample.

With reference to FIG. 3, the leakage current density Jg ranged between 0.43 and 55 $Acm^{-2}$ at an applied voltage of +1V. On the other hand, with reference to FIG. 4, the leakage current density Jg ranted between 0.84 and $7.88 \times 10^{-5}$ $Acm^{-2}$ at the applied voltage of +1V, which is a significant reduction in comparison with the case of FIG. 10. Further, in the case of FIG. 4, the film thickness ranged between 1.77 and 1.84 nm in terms of oxide equivalent thickness.

In this manner, according to the present invention, it is possible to significantly improve the leakage current characteristics of a high-K dielectrics gate insulation layer by covering the Si substrate surface by an oxygen atomic layer, and further covering the upper and lower sides of the high-K dielectric constant layer by the nitrogen atomic layer.

[The 2nd Embodiment]

FIGS. 5A through 5G show a manufacturing process of the semiconductor device 10 of a second embodiment of the present invention.

Figure 5A:
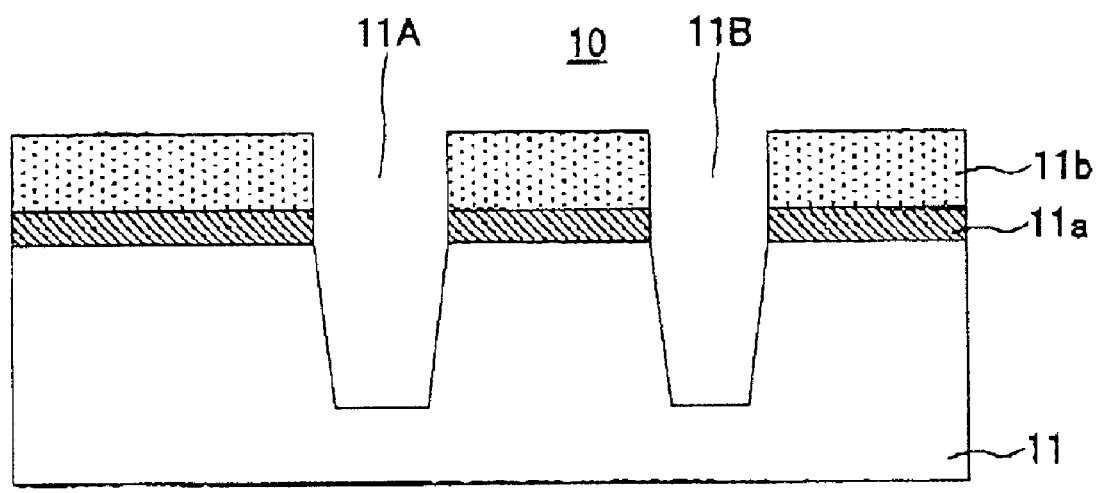
FIGS. 5A–5G are diagrams showing the fabrication process of a semiconductor device according to a second embodiment of the present invention.

With reference to FIG. 5A, on a p-type Si substrate 11 that has a surface orientation of (100), a thermal oxidation layer 11a is formed by a thermal oxidation processing, and a SiN film 11b is further formed by CVD on the thermal oxidation film 11a.

Further, at the process of FIG. 5A, openings corresponding to isolation areas are formed by dry etching patterning of the SiN film 11b, and further openings that expose the Si substrate 11 are formed by dry etching patterning applied to the thermal oxidation film 11a, using the SiN film 11b as a mask. Further, isolation slots 11A and 11B having an inclined sidewall are formed corresponding to the openings are formed by wet etching the exposed Si substrate 11, using the SiN film 11b as a mask.

Figure 5B:
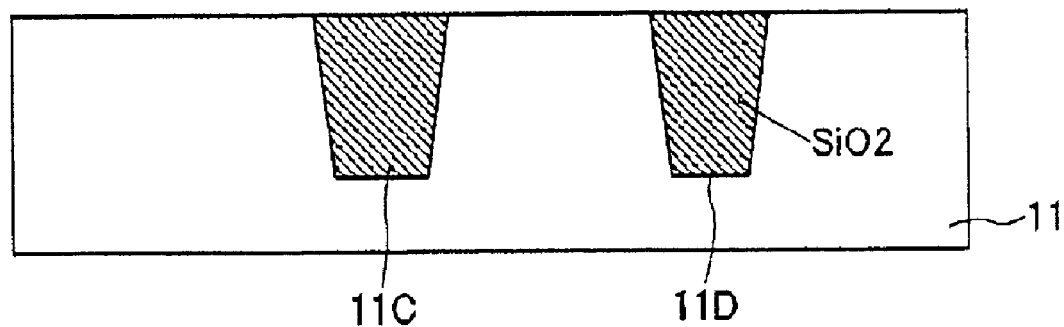

Next, at the process of FIG. 5B, thermal oxidation is applied to the structure of FIG. 5A, and a liner oxide film that is omitted in the figure is formed on the sidewall and the bottom of the isolation slots 11A and 11B. Then, the isolation slots 11A and 11B are filled with a $CVD-SiO_2$ film. Then, the $CVD-SiO_2$ film, the SiN film 11b under it, and the thermal oxidation film 11a under it are ground and removed by the CMP method, and the $SiO_2$ isolation regions 11C and 11D that fill the isolation slots 11A and 11B are formed.

Further, at the process of FIG. 5B, the surface of the Si substrate 11 is exposed, which is sacrifice-oxidized. Then, the sacrifice-oxidized surface is removed by an HF processing, such that a fresh Si substrate surface is exposed.

Figure 5C:
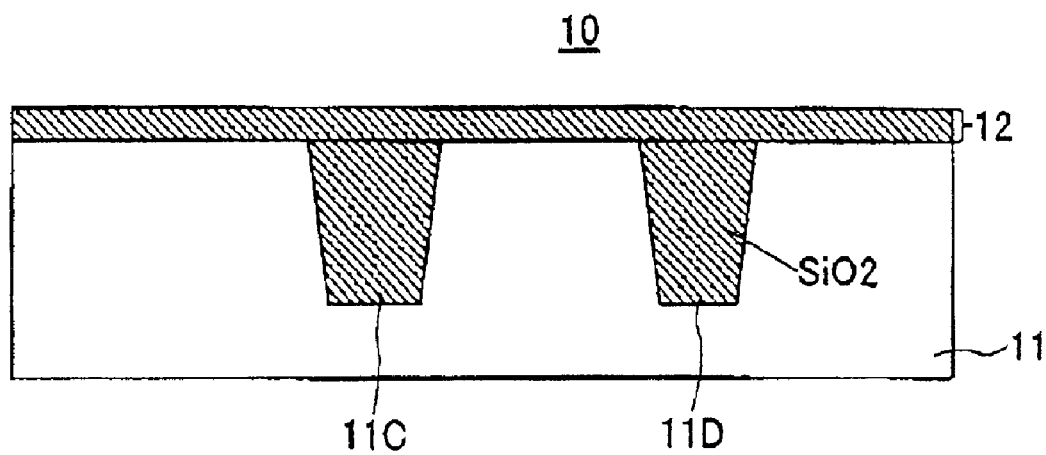

Next, in the process of FIG. 5C, processes of FIG. 1A through FIG. 1J previously explained are performed to the surface of the Si substrate 11 surface, and a gate insulation film 12 is formed, layer structure of which is as shown in FIG. 1J.

Figure 5D:
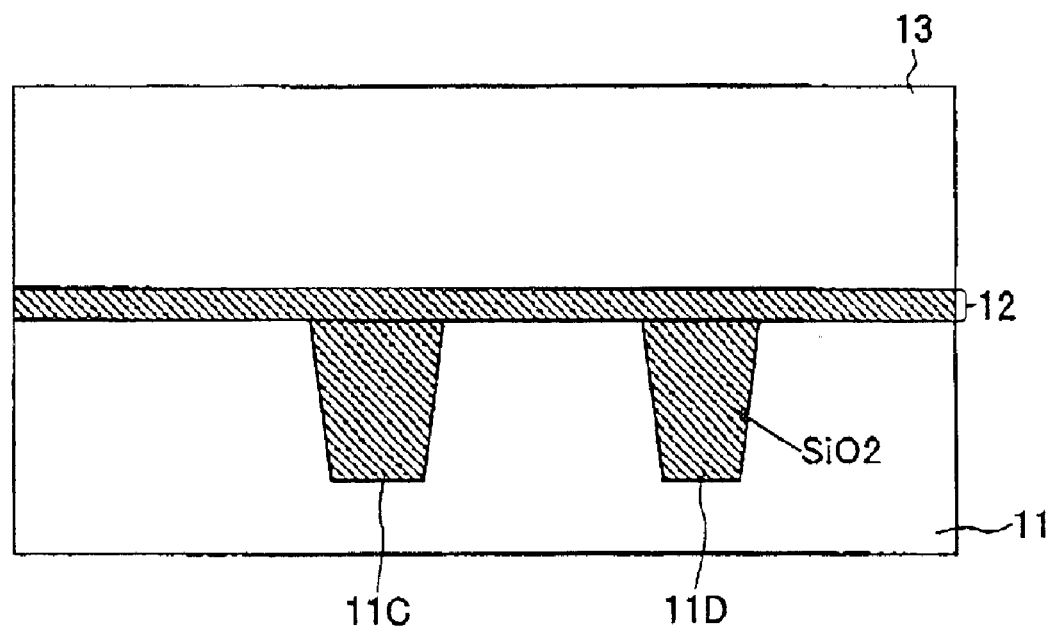

Next, in the process of FIG. 5D, a poly silicon layer 13 is deposited on the gate insulation film 12, resulting in the same structure as FIG. 2.

Figure 5E:
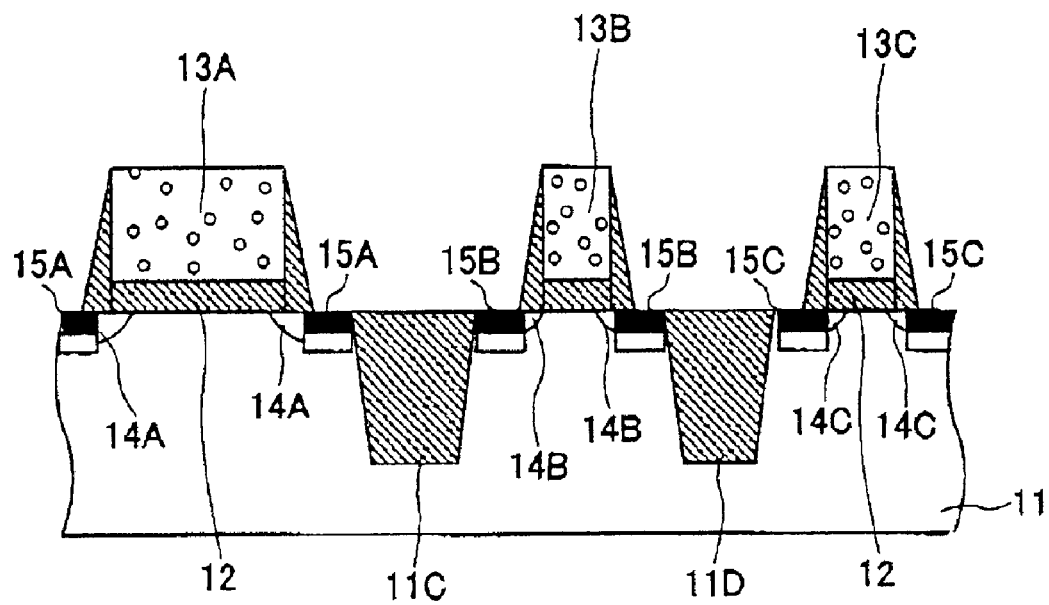

Then, at the process of FIG. 5E, the poly silicon film 13 and the gate insulation film 12 are patterned, and poly silicon gate electrodes 13A, 13B, and 13C are formed.

At the process of FIG. 5E, n-type impurities are implanted, using the poly silicon gate electrodes 13A through 13C as a mask. Thereby, LDD spread areas are formed inside the Si substrate 11. Specifically, an LDD spread area 14A is formed on the both sides of the gate electrode 13A, an LDD spread area 14B is formed on the both sides of the gate electrode 13B, and an LDD spread area 14C is further formed on the both sides of the gate electrode 13C.

At the process of FIG. 5E, a sidewall insulation film is formed on the sidewall of each of the gate electrodes 13A, 13B, and 13C. Ion implantation is performed, using the gate electrodes 13A, 13B and 13C and the sidewall film as a mask, thereby spread areas 15A, 15B, and 15C are formed outside each of the LDD spread areas 14A, 14B, and 14C.

Figure 5F:
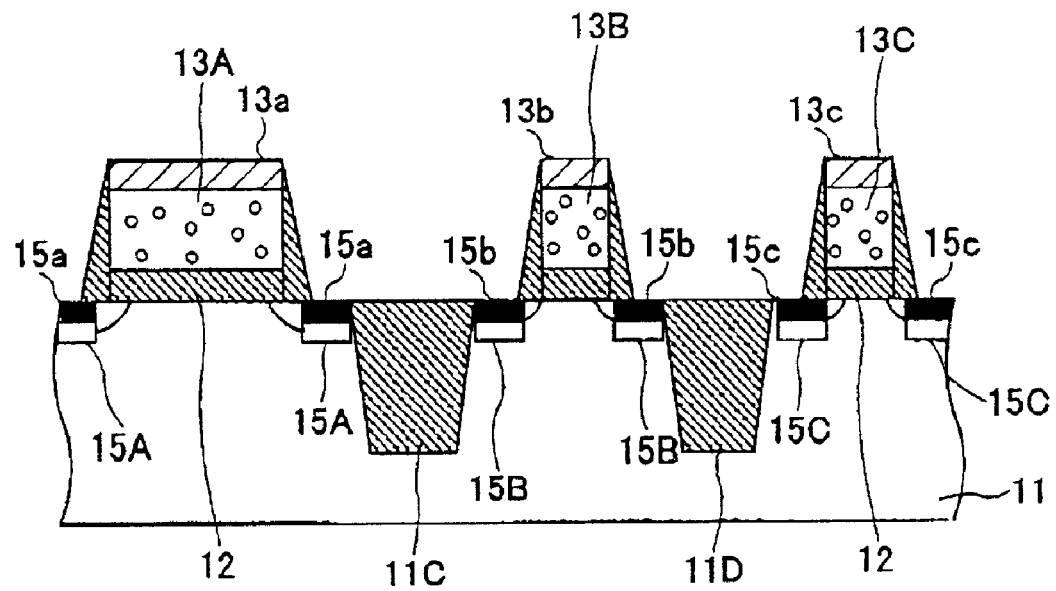

Further, at the process of FIG. 5F, low resistance silicide layers 13a through 13c and 15a through 15c of such as $CoSi_2$ are formed on the surface of the gate electrodes 13A through 13C and the spread areas 15A through 15C, respectively, by a salicide process.

Figure 5G:
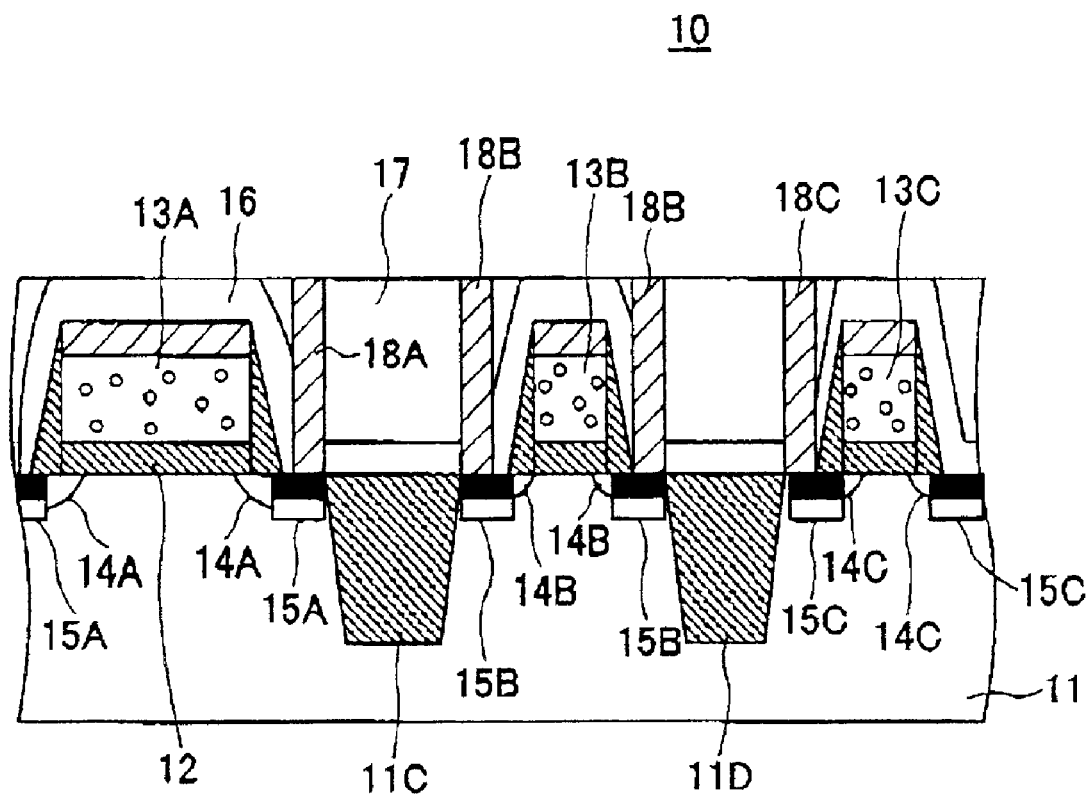

Finally, at the process of FIG. 5G, a SiN film 16 is formed by CVD on the structure of FIG. 5F such that the gate electrodes 13A through 13C are covered, and a layer insulation film 17 is further formed on the SiN film 16.

Then, the layer insulation film 17 is made flat by the CMF method, contact holes that expose the spread areas 15A through 15C are formed, and contact plugs 18A through 18C are formed in the contact holes such that the spread areas 15A through 15C, respectively, are contacted.

As above, the semiconductor device of the present invention includes a high-K dielectric gate insulation film as the gate insulation film 12 formed by the process of FIG. 5C, realizing short gate length of 0.1 micrometers or less. Physical film thickness of the gate insulation film of 1 through several nm is attained, suppressing the gate leakage current by the direct tunnel effect.

Further, the semiconductor device of the present invention includes an oxygen atomic layer in the portion where the gate insulation film 12 directly touches the Si substrate 11 that constitutes a channel region, stable threshold characteristics are attained without forming a dangling bond and an interface level in the interface between the substrate and the gate insulation film.

Further, with the semiconductor device of the present invention, since the high-K dielectric film is sandwiched by the nitrogen atomic layers, metallic elements and oxygen in the high-K dielectric film are not spread into the Si substrate 11 or the poly silicon gate electrodes 13A through 13C, resulting in excellent threshold characteristics. Further, spread of the dopant impurities to the Si substrate through the gate insulation film 12 from the poly silicon gate electrode is also suppressed, and a fluctuation of the threshold characteristics is suppressed.

Further, in this embodiment, since the nitrogen atomic layer is formed separately from the Si substrate surface by the oxygen atomic layer and the Si atomic layer, a fluctuation of the threshold characteristics due to the fixed charge of a nitrogen atom can be suppressed.

Further, in this embodiment, since the high-K dielectric layer is sandwiched by the oxygen atomic layers, the valence of metallic elements, such as Zr and Hf in the high-K dielectrics layer, is stabilized, and a problem, such as decline in the relative dielectric constant, can be avoided.

[The Third Embodiment]

Figure 6:
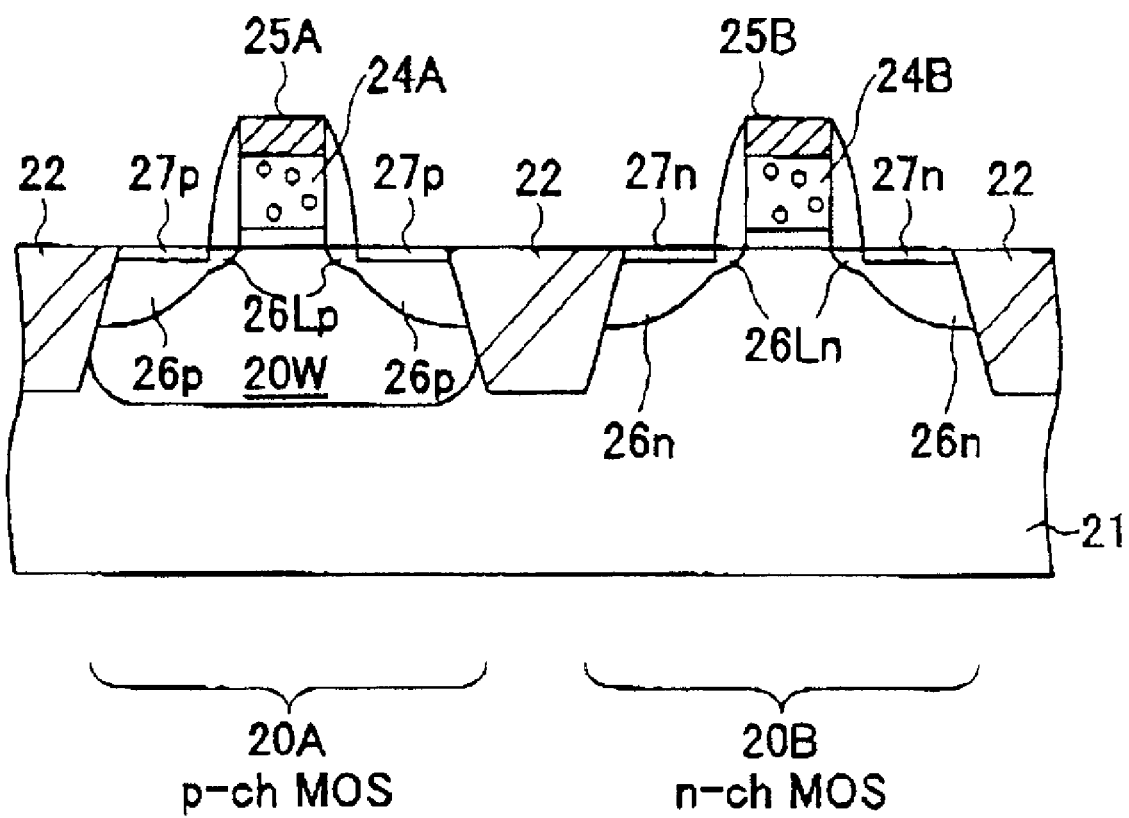
FIG. 6 is a diagram showing the structure of a CMOS semiconductor device according to a third embodiment of the present invention.

FIG. 6 shows a structure of a CMOS semiconductor device 20 of a third embodiment of the present invention.

With reference to FIG. 6, the CMOS semiconductor device 20 includes an isolation area 22 that divides a p-type Si substrate 21 into a p-channel MOS area 20A and an n-channel MOS area 20B. In the p-channel MOS area 20A, an n-type well 20W is formed.

In the p-channel MOS area 20A, a high-K dielectric gate insulation film 23A that has the same layer structure as shown in FIG. 1J is formed, corresponding to the channel region, and a poly silicon gate electrode 24A doped by B is formed on the gate insulation film 23A. Further, on the poly silicon gate electrode 24A, a silicide layer 25A is formed by the salicide process. Further, a sidewall film is formed on the both sides of the poly silicon gate electrode 24A.

In the p-channel MOS area 20A, a p-type LDO area 26Lp is formed corresponding to each side of the surface of the wall of the gate electrode 24A by ion implantation of B into the well 20W, and a p+ type spread area 26p is further formed outside the side wall insulation film. Further, a silicide low resistance layer 27p is formed on the surface of the p+ type spread area.

Similarly, in the n-channel MOS area 20B, a high-K dielectric gate insulation film 23B that has the same layer structure as shown in FIG. 1J is formed, corresponding to the channel region, and a poly silicon gate electrode 24B doped by As or P is formed on the gate insulation film 23B. Further, on the poly silicon gate electrode 24B, a silicide layer 25B is formed by the salicide process. Further, a sidewall film is formed on the both sides of the poly silicon-gate electrode 25B.

In the n-channel MOS area 20B, corresponding to the both sides of the surface of the wall of the gate electrode 24B, an n-type LDD area 26Ln is formed by ion implantation of As or P, and an n+ type spread area 26n is further formed outside the sidewall insulation film. Further, a silicide low resistance layer 27n is formed on the surface of the n+ type spread area 26n.

With the CMOS device of this structure, by using the high-K dielectric gate insulation film as shown in FIG. 1J, each of the p-channel MOS transistor and n-channel MOS transistor is formed with very short gate length of 0.1 micrometers or less. Therefore, when decreasing oxide equivalent film thickness of a gate insulation film, the gate insulation films 23A and 23B can be formed in 1 through several nm of physical film thickness, and an increase of the gate leakage current by the tunnel current can be avoided.

In the high-K dielectric gate insulation film of the structure of FIG. 1J, since the nitrogen atomic layers $NL1$ and $NL2$ are formed in the film, spread of oxygen and metallic elements, such as Hf and Zr, through the gate insulation film 23A and 23B is suppressed effectively. Further, since a high-quality $SiO_2$ molecule layer is formed in the portion that touches the Si channel region, formation of a dangling bond in the interface between the Si substrate and the gate insulation film, and an interface level are avoided, and stable threshold characteristics are attained. Further, since the nitrogen atomic layer $NL_1$ is formed separately from the Si substrate surface, a fluctuation of the threshold characteristics by the fixed charge of a nitrogen atom is also avoided.

Especially, with the CMOS semiconductor device of FIG. 6, in the p-channel MOS transistor using the poly silicon gate electrode 24A doped to p-type, the spread of B from poly silicon gate electrode 24A to the Si substrate 21 is suppressed by formation of the nitrogen atomic layers $NL_1$ and $NL_2$, and doping of the channel region that brings about a fluctuation of the threshold characteristics is avoided.

Further, the present invention is not limited to these embodiments, but various variations and modifications may be made without departing from the scope of the present invention.

What is claimed is:

1. A semiconductor device comprising:
   a channel area formed in a Si crystal layer,
   a gate insulation film formed on the channel area, containing a SiO layer that is formed on the Si crystal layer, a first SiN layer formed on the SiO layer, a dielectric metal oxide layer formed on the first SiN layer, and a second SiN layer formed on the dielectric metal oxide layer, and
   a gate electrode formed on the gate insulation film.

2. The semiconductor device as claimed in claim 1, wherein the SiO layer includes an oxygen atomic layer that uniformly covers surface of the Si substrate.

3. The semiconductor device as claimed in claim 2, wherein the oxygen atomic layer is a single atomic layer of oxygen.

4. The semiconductor device as claimed in claim 1, wherein the first SiN layer includes a nitrogen atomic layer that uniformly covers surface of the SiO layer.

5. The semiconductor device as claimed in claim 2, wherein the nitrogen atomic layer of the first SiN layer is a single atomic layer of nitrogen.

6. The semiconductor device as claimed in claim 2, wherein 90% or more of oxygen atoms of the oxygen atomic layer of the SiO layer are bonded with Si atoms on the surface of the Si crystal layer.

7. The semiconductor device as claimed in claim 4, wherein 90% or more of nitrogen atoms in the nitrogen atomic layer of the first SiN layer are bonded with Si atoms of the SiO layer.

8. The semiconductor device as claimed in claim 1, wherein each of the SiO layer, the first SiN layer, and the second SiN layer is about 1 molecule layer thick.

9. The semiconductor device as claimed in claim 1, wherein surface of the dielectric metal oxide layer is uniformly covered by an oxygen atomic layer that consists of oxygen atoms.

10. The semiconductor device as claimed in claim 1, wherein the second SiN layer includes a nitrogen atomic layer that uniformly covers the dielectric metal oxide layer.

11. The semiconductor device as claimed in claim 10, wherein the nitrogen atomic layer of the second SiN layer is a single atomic layer of nitrogen.

12. The semiconductor device as claimed in claim 9, wherein nitrogen atoms in the nitrogen atomic layer of the second SiN layer are primarily bonded with oxygen atoms in the oxygen atomic layer that covers the dielectric metal oxide layer surface.

13. The semiconductor device as claimed in claim 1, wherein the dielectric metal oxide layer is a lamination of an oxygen atomic layer of oxygen atoms and a metal atomic layer of metal atoms, laminated alternately, each layer being in single atom thickness.

14. The semiconductor device as claimed in claim 1, wherein the dielectric metal oxide layer is one of an oxide and a silicate of metallic elements chosen from at least one of Zr, Hf, Sr, Ba Ta, Ti, Y Lr, and lanthanoid.

15. The semiconductor device as claimed in claim 1, wherein the gate electrode consists of poly silicon.

16. A semiconductor device, comprising:
    a Si substrate,
    a gate insulation film formed on the Si substrate, and
    a gate electrode formed on the gate insulation film; wherein the gate insulation film, comprising:
    a first insulation film that comprises an oxygen atomic layer consisting of oxygen atoms, each of which is bonded with a Si atom of surface of the Si substrate, a first Si atomic layer consisting of Si atoms, each of which is bonded with an oxygen atom in the oxygen atomic layer, a nitrogen atomic layer consisting of nitrogen atoms, each of which is bonded with a Si atom in the Si atomic layer, and a second Si atomic layer, consisting of Si atoms, each of which is bonded with a nitrogen atom in the nitrogen atomic layer,
    a second insulation film that comprises an oxygen atomic layer consisting of oxygen atoms, each of which is bonded with a Si atom in the second Si atomic layer, a metal atomic layer consisting of metal atoms, each of which is bonded with an oxygen atom in the oxygen atomic layer, an oxygen atomic layer consisting of oxygen atoms, each of which is bonded with a metal atom in the metal atomic layer, and, at the topmost part, a topmost oxygen atomic layer consisting of oxygen atoms, each of which is bonded with a metal atom in the metal atomic layer, and
    a third insulation film that comprises a Si atomic layer that covers the topmost oxygen atomic layer, consisting of Si atoms, each of which is bonded with an oxygen atom in the topmost oxygen atomic layer, and a nitrogen atomic layer, consisting of nitrogen atoms, each of which is bonded with a Si atom in the Si atomic layer that covers the topmost oxygen atomic layer.

17. A complementary type semiconductor device, comprising:
    a Si substrate having a first device area of a first conductivity type, and a second device area of a second conductivity type, which are separated by an isolation area,
    a first gate insulation film formed in the first device area of the Si substrate,
    a second gate insulation film formed in the second device area of the Si substrate,
    a first gate electrode formed on the first gate insulation film, and
    a second gate electrode formed on the second gate insulation film; wherein each of the first gate insulation film and the second gate insulation film comprises:
    a first insulation film, comprising an oxygen atomic layer consisting of oxygen atoms, each of which is bonded with a Si atom of the Si substrate surface, a first Si atomic layer consisting of Si atoms, each of which is bonded with an oxygen atom in the oxygen atomic layer, a nitrogen atomic layer consisting of nitrogen atoms, each of which is bonded with a Si atom in the Si atomic layer, and a second Si atomic layer consisting of Si atoms, each of which is bonded with a nitrogen atom in the nitrogen atomic layer,
    a second insulation film, comprising an oxygen atomic layer consisting of oxygen atoms, each of which is bonded with a Si atom in the Si atomic layer, a metal atomic layer consisting of metal atoms, each of which is bonded with an oxygen atom in the oxygen atomic layer, an oxygen atomic layer consisting of oxygen atoms, each of which is bonded with a metal atom in the metal atomic layer, and, at topmost, a topmost oxygen atomic layer consisting of oxygen atoms, each of which is bonded with a metal atom in the metal atomic layer, and a third insulation film, comprising a Si atomic layer that covers the topmost oxygen atomic layer, consisting of Si atoms, each of which is bonded with an oxygen atom of the topmost oxygen atomic layer, and a nitrogen atomic layer, consisting of nitrogen atoms, each of which is bonded with a Si atom in the Si atomic layer that covers the topmost oxygen atomic layer.

* * * * *